(12) United States Patent
Tseng et al.

(10) Patent No.: US 9,082,942 B2
(45) Date of Patent: Jul. 14, 2015

(54) METHOD AND APPARATUS FOR PACKAGING PHOSPHOR-COATED LEDS

(71) Applicant: TSMC Solid State Lighting Ltd., Hsinchu (TW)

(72) Inventors: Chi-Xiang Tseng, Kaohsiung (TW); Hsiao-Wen Lee, Hsinchu (TW); Min-Sheng Wu, Taoyuan County (TW); Tien-Min Lin, Chiayi (TW)

(73) Assignee: TSMC SOLID STATE LIGHTING LTD., Hsinchu (TW)

( * ) Notice: Subject to any disclaimer, the term of this patent is extended or adjusted under 35 U.S.C. 154(b) by 0 days.

(21) Appl. No.: 14/140,973

(22) Filed: Dec. 26, 2013

(65) Prior Publication Data

US 2014/0103372 A1    Apr. 17, 2014

Related U.S. Application Data

(60) Division of application No. 13/788,536, filed on Mar. 7, 2013, which is a continuation-in-part of application No. 13/594,219, filed on Aug. 24, 2012, now Pat. No. 8,765,500.

(51) Int. Cl.
*H01L 33/50* (2010.01)
*H01L 33/46* (2010.01)

(52) U.S. Cl.
CPC ............ *H01L 33/504* (2013.01); *H01L 33/505* (2013.01); *H01L 33/46* (2013.01); *H01L 2933/0041* (2013.01)

(58) Field of Classification Search
USPC .................... 257/13, 79–103, 918, 257/E51.018–E51.022, E33.001–E33.077, 257/E25.032, E25.028; 438/22–47, 69, 438/493, 503, 507, 956
See application file for complete search history.

(56) References Cited

U.S. PATENT DOCUMENTS

| | | | |
|---|---|---|---|
| 7,816,463 B2 | 10/2010 | Zhan | |
| 2011/0084296 A1* | 4/2011 | Cheng | 257/98 |
| 2012/0068208 A1* | 3/2012 | Tseng et al. | 257/98 |
| 2013/0187178 A1* | 7/2013 | Tischler | 257/88 |
| 2013/0200398 A1* | 8/2013 | Wang et al. | 257/88 |

FOREIGN PATENT DOCUMENTS

KR    10-2011-0040694    4/2011

OTHER PUBLICATIONS

Office Action mailed Dec. 29, 2014 in Korean Patent Application No. 10-2013-0099044, 8 pages.

\* cited by examiner

*Primary Examiner* — Mamadou Diallo
(74) *Attorney, Agent, or Firm* — Muncy, Geissler, Olds & Lowe, P.C.

(57) ABSTRACT

The present disclosure involves a method of packaging light-emitting diodes (LEDs). According to the method, a plurality of LEDs is provided over an adhesive tape. The adhesive tape is disposed on a substrate. In some embodiments, the substrate may be a glass substrate, a silicon substrate, a ceramic substrate, and a gallium nitride substrate. A phosphor layer is coated over the plurality of LEDs. The phosphor layer is then cured. The tape and the substrate are removed after the curing of the phosphor layer. A replacement tape is then attached to the plurality of LEDs. A dicing process is then performed to the plurality of LEDs after the substrate has been removed. The removed substrate may then be reused for a future LED packaging process.

20 Claims, 18 Drawing Sheets

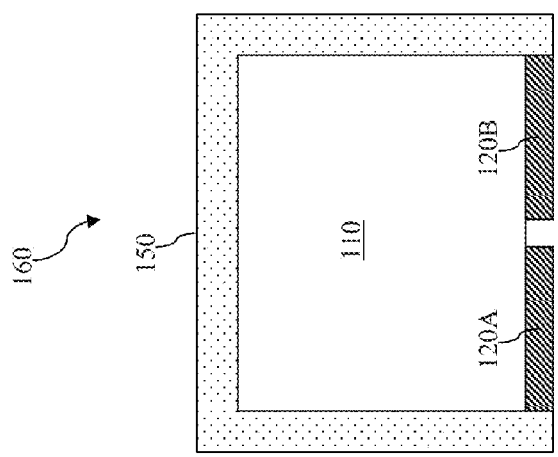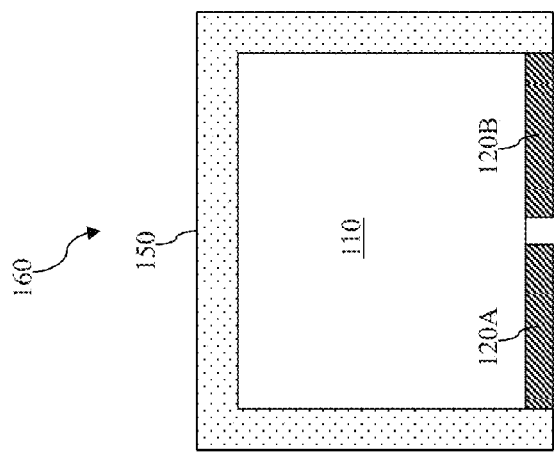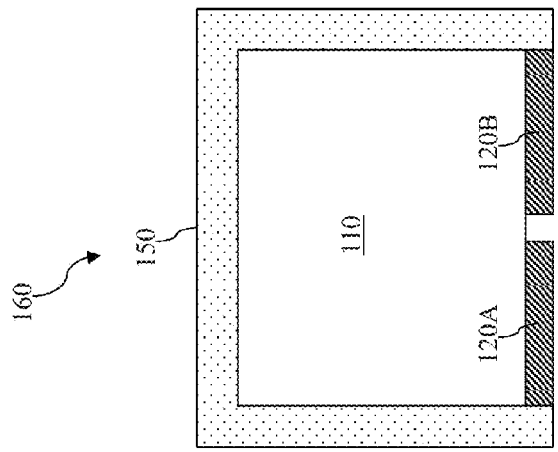
Fig. 5

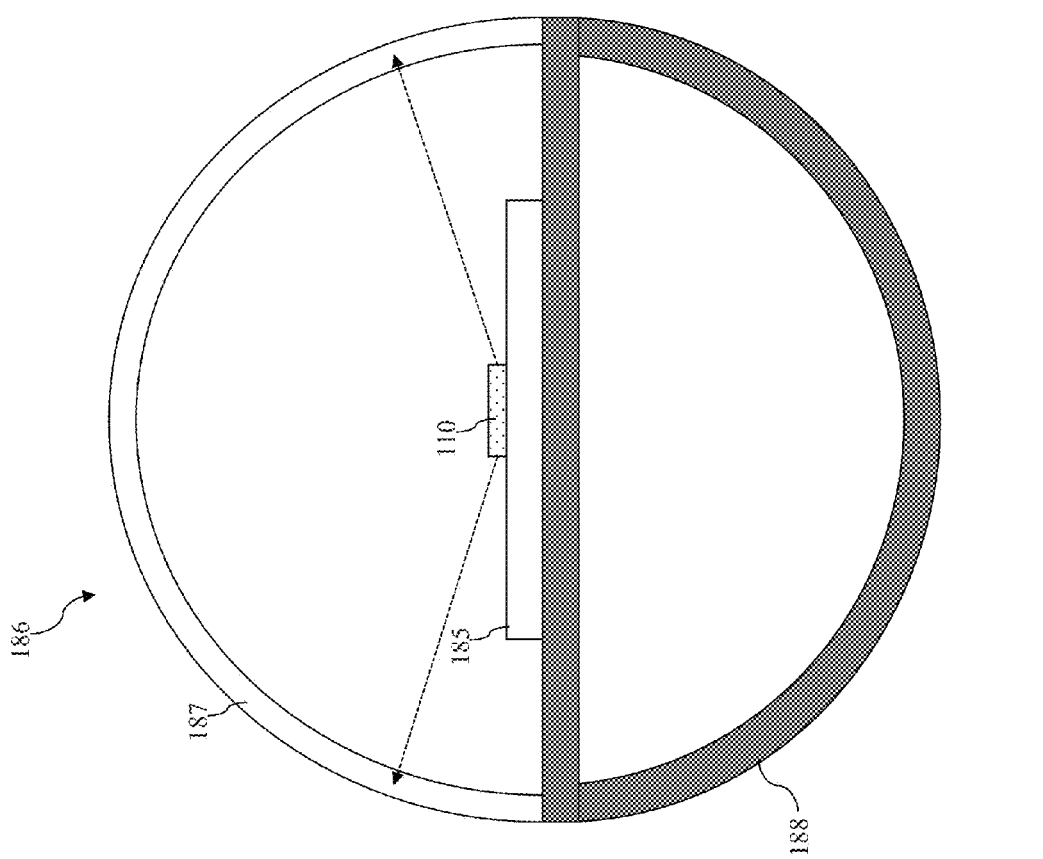

METHOD AND APPARATUS FOR PACKAGING PHOSPHOR-COATED LEDS

PRIORITY DATA

The present application is a divisional application of U.S. patent application Ser. No. 13/788,536, filed on Mar. 7, 2013, entitled "Method and Apparatus for Packaging Phosphor-Coated LEDs" and a continuation-in-part (CIP) application of U.S. application Ser. No. 13/594,219, filed on Aug. 24, 2012, entitled "Method and Apparatus for Fabricating Phosphor-Coated LED Dies", the disclosures of which are hereby incorporated by reference in their entirety.

TECHNICAL FIELD

The present disclosure relates generally to light-emitting devices, and more particularly, to the packaging of phosphor-coated light-emitting diodes (LEDs).

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

Conventionally, some LED packaging processes involve using a carrier substrate for support. As an LED dicing process is performed to singulate the LEDs, the carrier substrate is also sliced. This results in the waste of the carrier substrate, as the sliced carrier substrate may not be used in fabrication again.

Therefore, although existing methods of packaging LEDs have been generally adequate for their intended purposes, they have not been entirely satisfactory in every aspect. A cheaper and more efficient way of packaging LEDs continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

FIGS. 1-7 and 9-10 are diagrammatic fragmentary cross-sectional side views of a plurality of LEDs undergoing a packaging process according to various aspects of the present disclosure.

FIGS. 11A and 11B are a diagrammatic fragmentary top view and a cross-sectional view, respectively, of an embodiment of an LED lighting module according to various aspects of the present disclosure.

DETAILED DESCRIPTION

Figure 1:
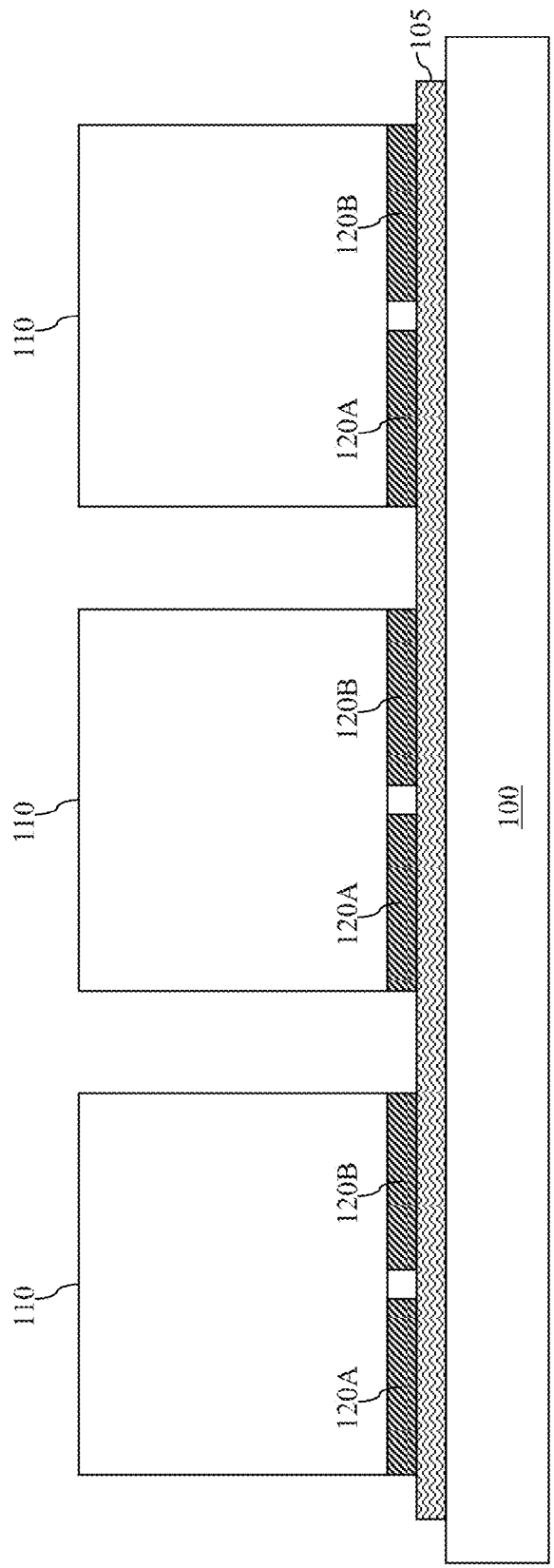

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

As light sources, LED dies or emitters may not naturally emit the color of light that is desirable for a lighting instrument. For example, many LED emitters naturally emit blue light. However, it is desirable for an LED-based lighting instrument to produce a light that is closer to a white light, so as to emulate the light output of traditional lamps. Therefore, photoconversion materials such as phosphor have been used to reconfigure the light output color from one to another. For example, a yellow phosphor material can change the blue light emitted by an LED die to a color close to white. In certain LED packaging processes, the phosphor material may be coated on a plurality of LEDs disposed over a carrier substrate. As a dicing process is performed to separate the LEDs from adjacent LEDs (i.e., singulation), the carrier substrate underneath is also diced. The diced carrier substrate may not be reusable again. Thus, conventional LED packaging processes may lead to waste and inefficiencies in fabrication.

According to various aspects of the present disclosure, described below is a method of packaging phosphor-coated LEDs without wasting the carrier substrate.

FIGS. 1-6 are simplified diagrammatic cross-sectional side views of a plurality of LEDs at various stages of packaging according to some embodiments of the present disclosure. Referring to FIG. 1, a substrate 100 is provided. The substrate 100 may include a glass substrate, a silicon substrate, a ceramic substrate, a gallium nitride substrate, or any other suitable substrate that can provide mechanical strength and support. The substrate 100 may also be referred to as a carrier substrate. A tape 105 is disposed on the substrate 100. In some embodiments, the tape 105 may contain an adhesive material.

A plurality of semiconductor photonic dies 110 are disposed on the tape 105. The semiconductor photonic dies 110 function as light sources for a lighting instrument. The semiconductor photonic dies 110 are LED dies in the embodiments described below, and as such may be referred to as LED dies 110 in the following paragraphs. As shown in FIG. 1, the LED dies 110 are physically spaced apart from one another. In some embodiments, the LED dies 110 are substantially evenly spaced apart from adjacent LED dies.

The LED dies 110 each include two differently doped semiconductor layers formed, or grown, on a growth substrate. The growth substrate may be sapphire, silicon, silicon carbide, gallium nitride, etc, and is included in each of the LED dies 110 shown herein. The oppositely doped semiconductor layers have different types of conductivity. For example, one of these semiconductor layers contains a material doped with an n-type dopant, while the other one of the two semiconductor layers contains a material doped with a p-type dopant. In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In certain embodiments, the oppositely doped semiconductor layers include a p-doped gallium nitride (p-GaN) material and an n-doped gallium nitride material (n-GaN), respectively. The p-type dopant may include Magnesium (Mg), and the n-type dopant may include Carbon (C) or Silicon (Si).

The LED dies 110 also each include a light emitting layer such as a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses. In certain alternative embodiments, suitable light-emitting layers other than an MQW layer may be used instead.

Each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by one or more epitaxial growth processes known in the art. For example, these layers may be formed by processes such as metal organic vapor phase epitaxy (MOVPE), molecular-beam epitaxy (MBE), metal organic chemical vapor deposition (MOCVD), hydride vapor phase epitaxy (HVPE), liquid phase epitaxy (LPE), or other suitable processes. These processes may be performed at suitable deposition processing chambers and at high temperatures ranging from a few hundred degrees Celsius to over one thousand degrees Celsius.

The n-doped semiconductor layer, the p-doped semiconductor layer, and the MQW disposed in between collectively constitute a core portion of an LED. When an electrical voltage (or electrical charge) is applied to the doped layers of the LED 110, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. For example, the LED dies 110 herein may be blue LED emitters, in other words, they are configured to emit blue light. In certain embodiments, a center wavelength (or peak wavelength) of the LED dies 110 is tuned to be in a range from about 440 nm to about 465 nm.

As shown in FIG. 1, each LED die 110 also includes two conductive terminals 120A and 120B, which may include metal pads. Electrical connections to the LED dies 110 may be established through the conductive terminals 120A/120B. In the embodiments discussed herein, one of the conductive terminals 120A/120B is a p-terminal (i.e., electrically coupled to the p-GaN layer of the LED die 110), and the other one of the conductive terminals 120A/120B is an n-terminal (i.e., electrically coupled to the n-GaN layer of the LED die 110). Thus, an electrical voltage can be applied across the terminals 120A and 120B (through the conductive pads 60B) to generate a light output from the LED die 110.

In certain embodiments, the LED dies 110 shown herein have already undergone a binning process. In more detail, a plurality of LED dies has been fabricated using standard LED fabrication processes. These LED dies may have varying performance characteristics in different areas such as light output intensity, color, current consumption, leakage, resistance, etc. A binning process involves dividing or assigning these LED dies into different categories (or bins) according to each die's performance in these performance areas. For example, a bin 1 may include LED dies that have a light output density that meets a predefined threshold, a bin 10 may include LED dies that have serious performance failures and thus need to be discarded, so on and so forth. After the LED dies are binned, a subset of the LED dies from one or more certain bins are chosen to be attached herein as the LED dies 110. The selected subset of LED dies 110 may also be referred to as reconstructed LED dies.

It is also understood that the spacing between adjacent LED dies 110 may be tunable. In other words, depending on design requirements and manufacturing concerns, the spacing between the adjacent LED dies 110 may be increased or decreased prior to their disposition on the tape 105. In certain embodiments, the spacing separating adjacent LED dies 110 is in a range from about 0.5 mm to about 2 mm, for example about 1 mm.

Figure 2:
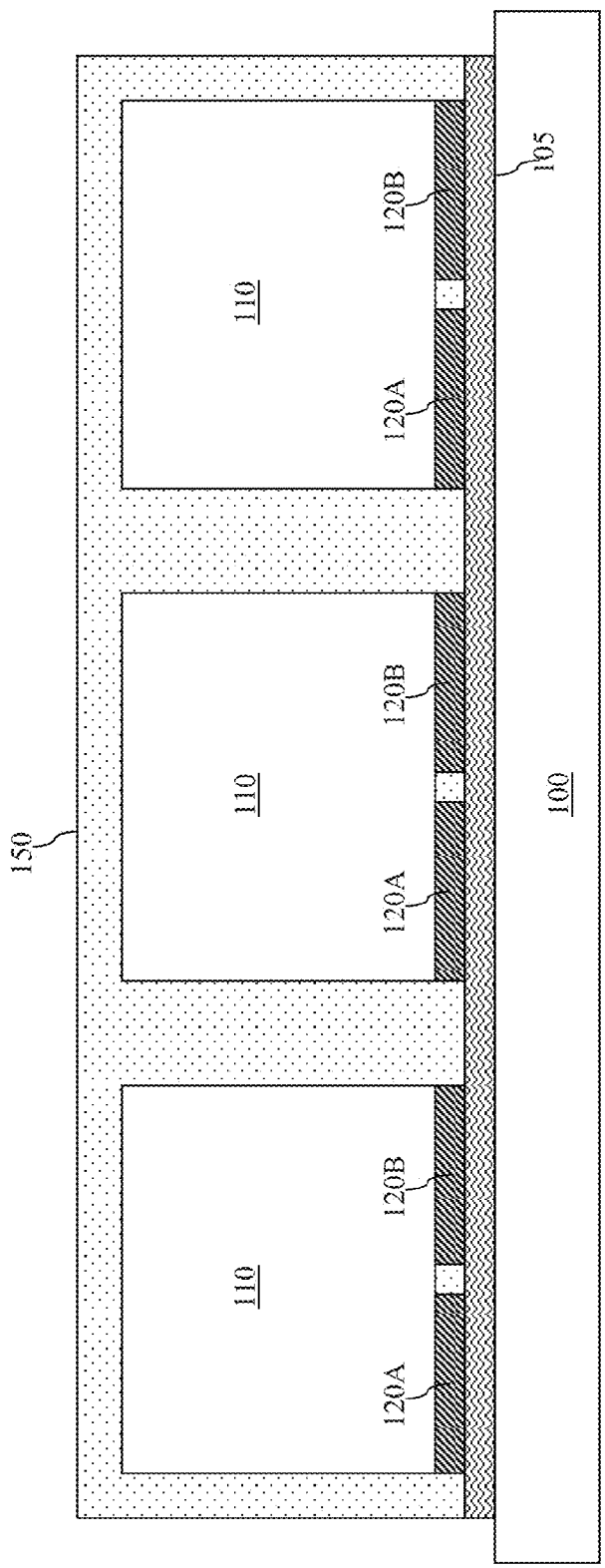

Referring now to FIG. 2, a photo-conversion material 150 such as a phosphor film is coated around all the LED dies 110 collectively. In more detail, the phosphor film 150 is coated around the exposed surfaces of the LED dies 110, as well as on the exposed surfaces of the tape 105 and/or the substrate 100. The phosphor film 150 may include either phosphorescent materials and/or fluorescent materials. The phosphor film 150 is used to transform the color of the light emitted by an LED dies 110. In some embodiments, the phosphor film 150 contains yellow phosphor particles and can transform a blue light emitted by an LED die 110 into a different wavelength light. In other embodiments, a dual phosphor may be used, which may contain yellow powder and red powder phosphor. By changing the material composition of the phosphor film 150, the desired light output color (e.g., a color resembling white) may be achieved. In some embodiments, the phosphor film 150 includes at least two sub-layers (i.e., a composite layer structure). For example, one of these sub-layers may contain a gel mixed with phosphor particles, while the other one of these sub-layers may contain a gel mixed with diffuser particles. As another example, one of these sub-layers may contain yellow phosphor particles mixed with gel, while the other one of these sub-layers may contain red phosphor particles mixed with gel.

The phosphor film 150 may be coated on the surfaces of the LED dies 110 in a concentrated viscous fluid medium (e.g., liquid glue or gel). In certain embodiments, the viscous fluid may include silicone epoxy and have a refractive index in a range from about 1.4 to about 2. In some embodiments, diffuser particles may also be mixed in the viscous fluid. The diffuser particles may include, as examples, silica, PMMA, $ZrO_2$, or silicon. In some other embodiments, one layer of the viscous fluid may be mixed with the phosphor particles, while another layer of the viscous fluid may be mixed with the diffuser particles, and then one of the two layers of the viscous fluid is applied over the other. Similarly, in some embodiments, one layer of the viscous fluid may be mixed with yellow phosphor, while the other layer of the viscous fluid may be mixed with red phosphor. The phosphor film 150 is used herein to denote a single layer of phosphor mixed with the gel, or multiple layers of phosphor mixed with the gel. As the viscous liquid sets or cures, the phosphor material becomes a part of the LED package. In some embodiments, a curing temperature in a range between about 130 degrees Celsius to about 170 degrees Celsius is used.

Wafer probing may also be performed at this stage. In other words, the LED dies 110 may be electrically accessed through the conductive terminals 120A and 120B. This wafer probing process may be done to evaluate the light output performance from the LED dies 110, for example performance with respect to the color temperature of the LED dies 110, etc. If the light output performance is unsatisfactory, the recipe for the phosphor material 150 may be modified to improve the light output performance.

Figure 3:
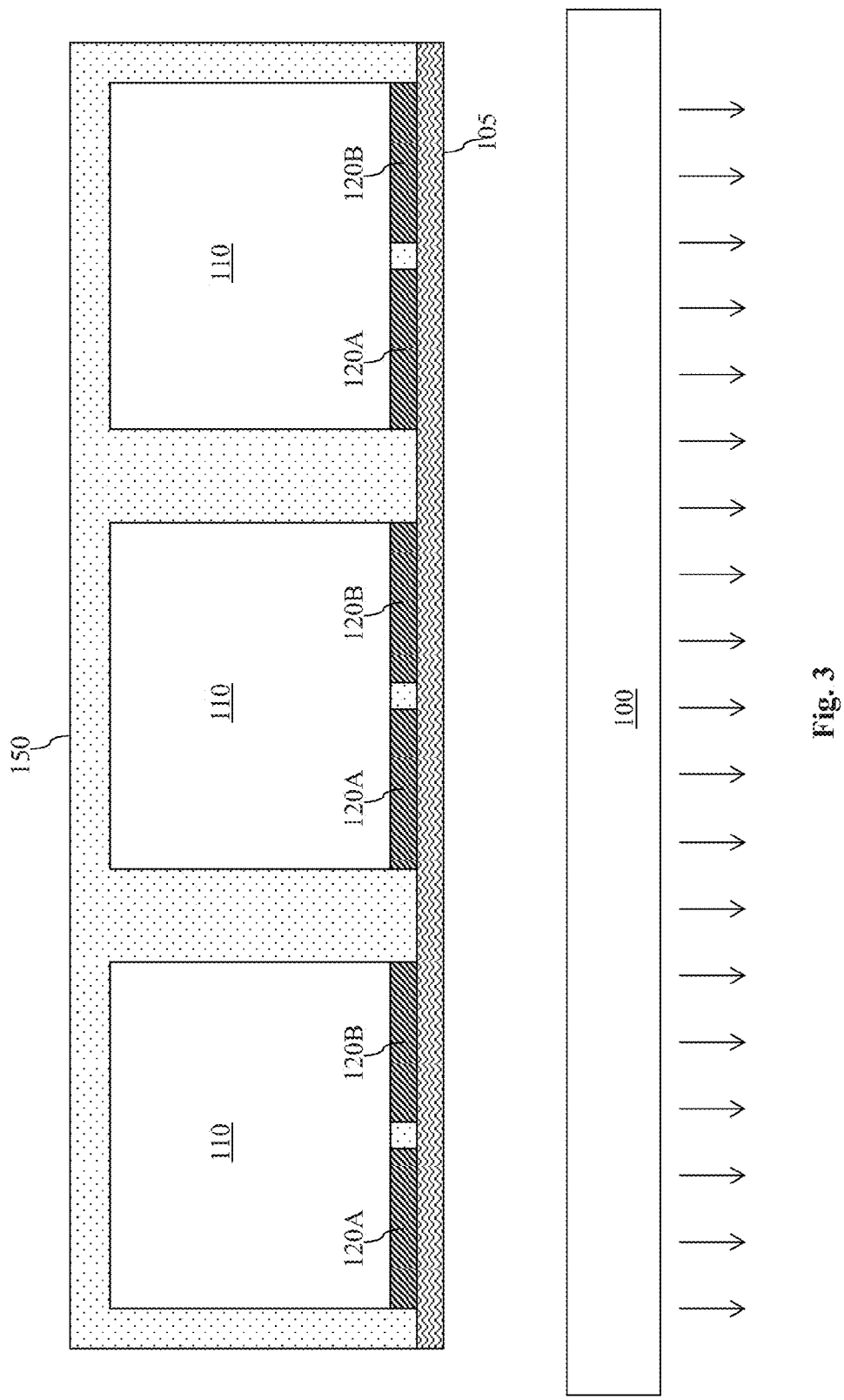

Referring now to FIG. 3, the substrate 100 is removed. In some embodiments, the substrate 100 is removed through a laser lift-off process. In other embodiments, the substrate 100 may be removed using an etching process or another suitable process.

Figure 4:
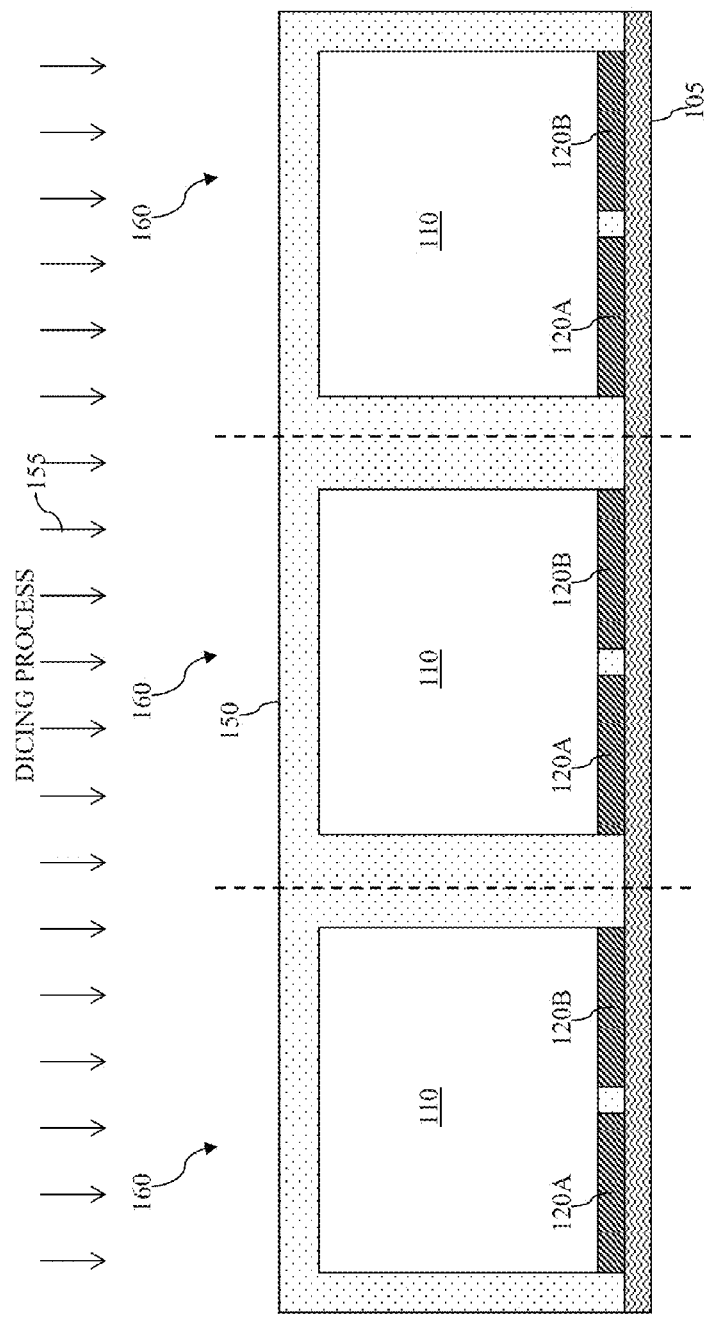

Thereafter, referring to FIG. 4, a dicing process 155 is performed to singulate the LED dies 110. In some embodiments, the dicing process 155 is performed using a die saw. In alternative embodiments, other suitable cutting/slicing means may be used. As a part of the dicing process 155, the phosphor material 150 between adjacent LED dies 110 is sliced completely through to separate the LED dies 110. In this manner, a plurality of single junction phosphor chips 160 (shown in FIG. 5) is created. Each chip 160 includes an LED die 110 surrounded by a phosphor film 150. In other words, the phosphor coating is collectively applied to all the LED dies 110 before these LED dies are diced and undergo individual package processing. The tape 105 is removed from each chip 160. In some embodiments, a footprint of the chip 160 ranges from about (1-2 millimeters)×(1-2 millimeters).

Figure 6:
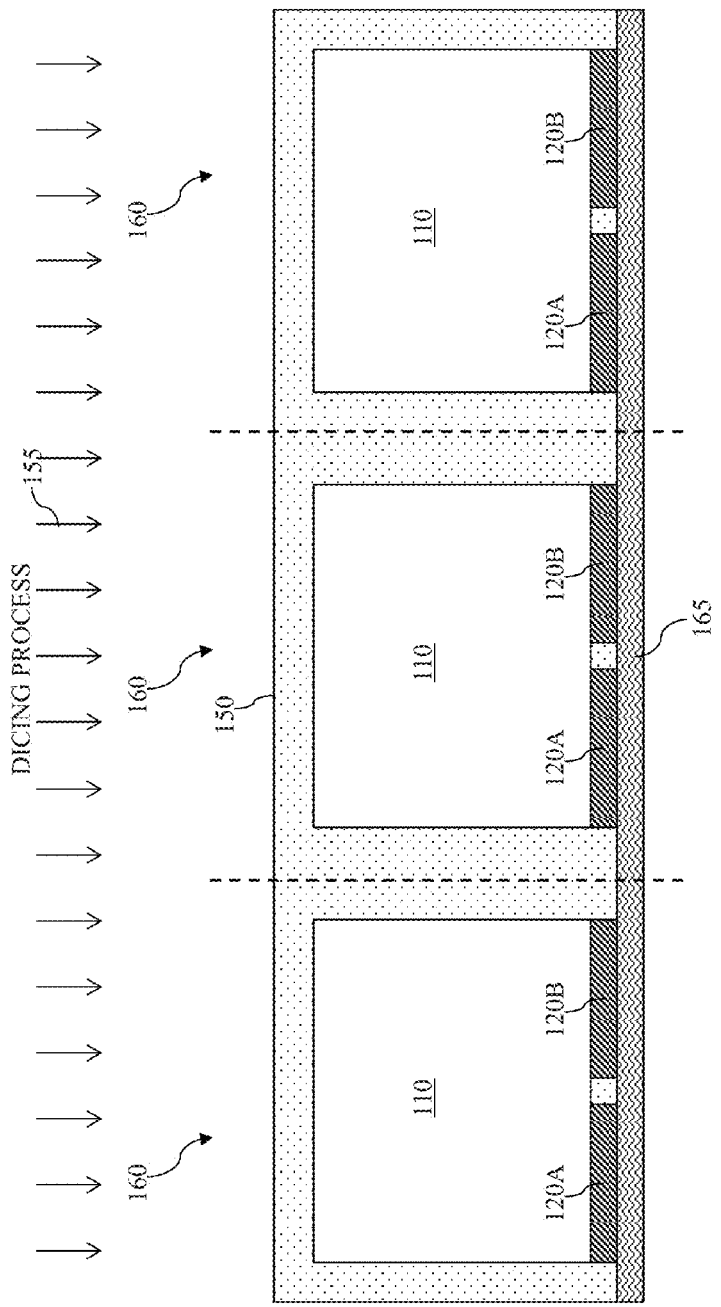

In some scenarios, the tape 105 may become damaged while the substrate 100 is removed (FIG. 3). In these cases, the damaged tape 105 may also be removed from the LED dies 110, and a new tape 165 may be used to re-tape the LED dies 110 before the dicing process 155 is performed, as shown in FIG. 6.

Regardless of whether the new tape 165 is used, it can be seen that the substrate 100 is removed before the dicing process 155 takes place. By doing so, several advantages are offered over existing methods, though it is understood that not all advantages are discussed herein, other embodiments may offer different advantages, and that no particular advantage is required for any embodiment. One advantage is that the removal of the substrate 100 means that it is not cut or diced by the dicing process 155. Consequently, the substrate 100 is substantially unscathed and may be used again for future fabrication. For example, the substrate 100 may be used as a carrier substrate for a different batch of LED dies. The reusability of the substrate 100 reduces LED fabrication costs. Another advantage is that, since the substrate 100 need not be a part of the dicing process 155, the dicing process 155 can be performed faster, which enhances the efficiency of the LED packaging. In addition, the embodiments of the present disclosure entail flexible processes that can be easily integrated into existing LED fabrication/packaging process flow.

Figure 7:
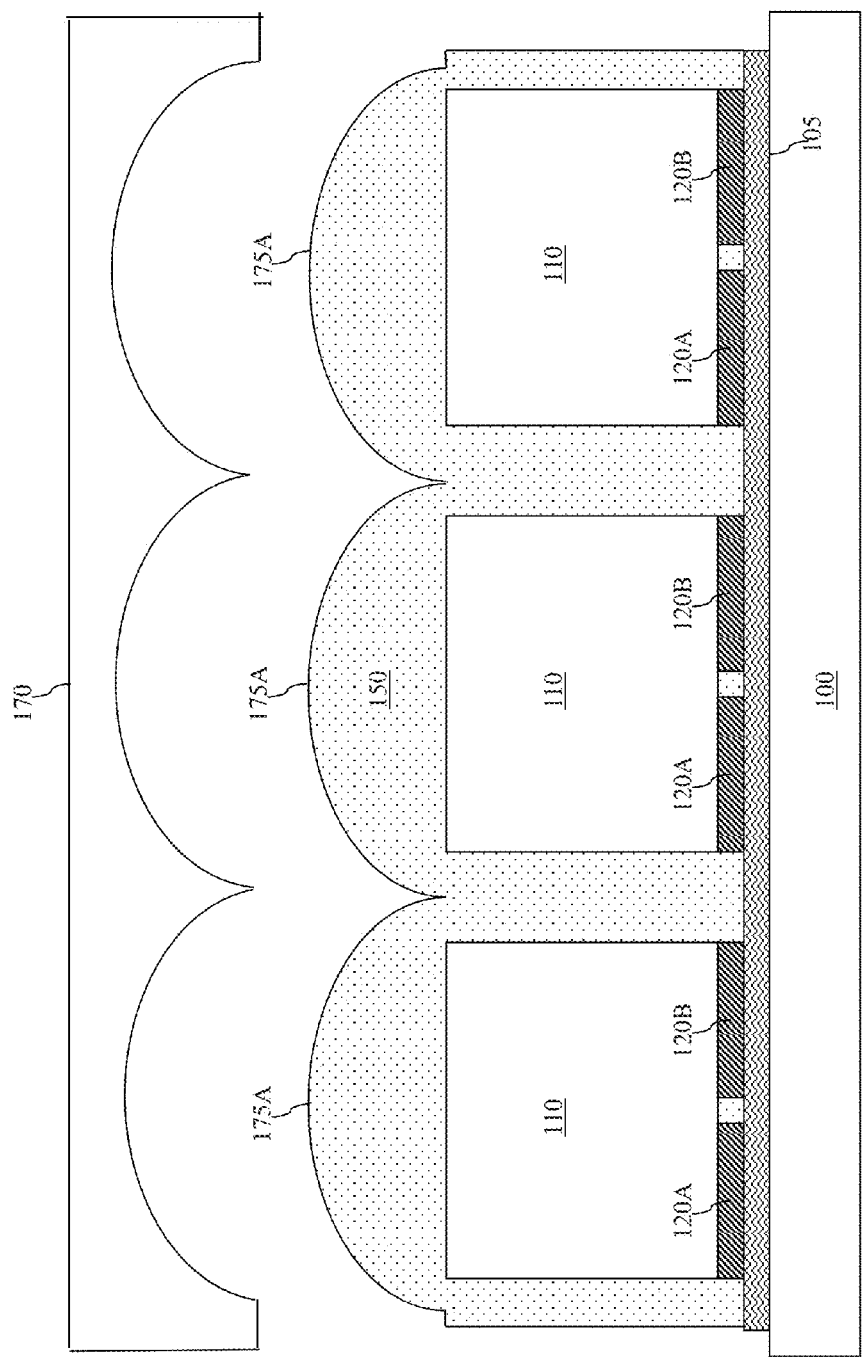
Figure 8A:
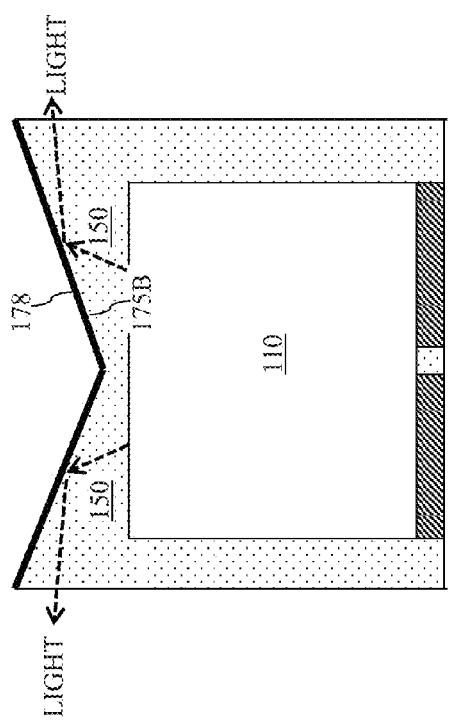
FIGS. 8A-8C are diagrammatic fragmentary cross-sectional side views of differently-shaped side-lit batwing LED dies according to various aspects of the present disclosure.
Figure 8B:
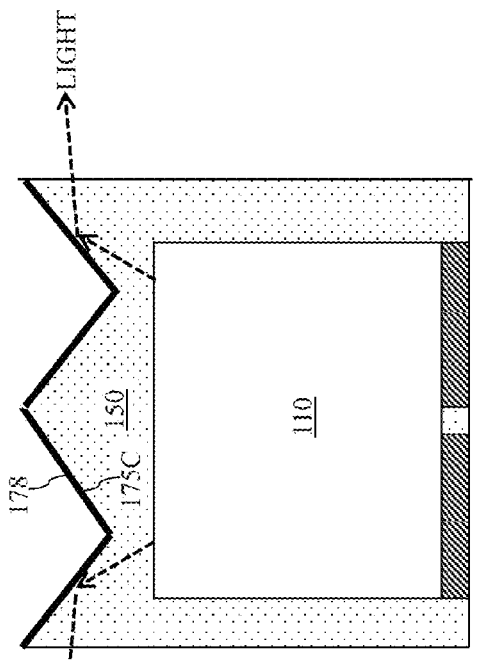
Figure 8C:
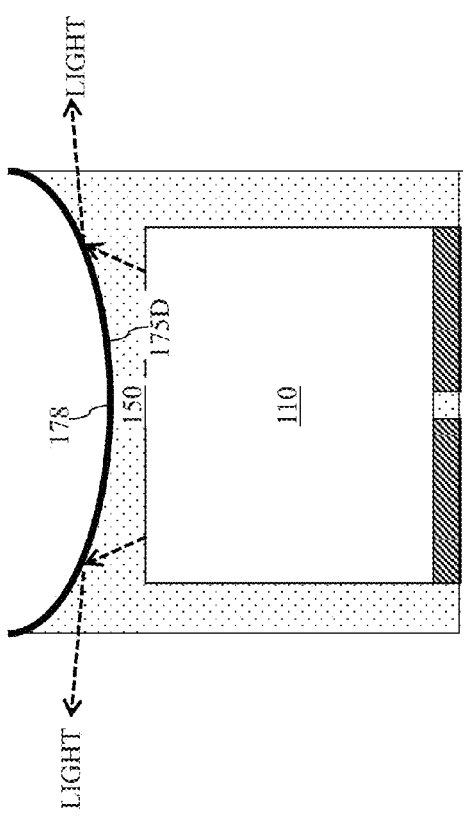
Figure 9:
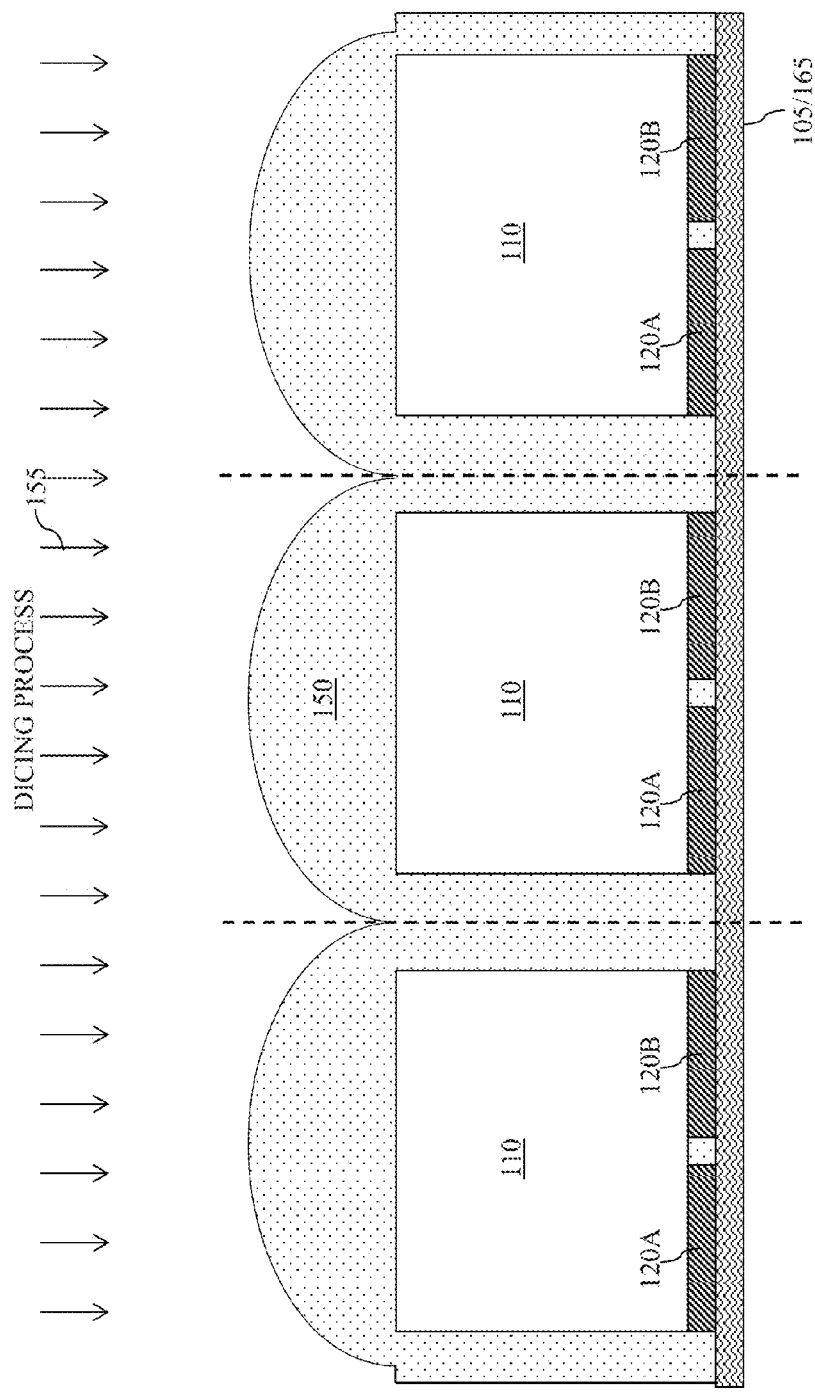

FIGS. 7-9 are simplified diagrammatic cross-sectional side views of a plurality of LEDs at various stages of packaging according to some alternative embodiments of the present disclosure. For reasons of consistency and clarity, similar components appearing in FIGS. 1-9 will be labeled the same. Referring to FIG. 7, a plurality of LED dies 110 are disposed on the substrate 100. A phosphor film 150 is also coated around the LED dies 110. Unlike the embodiment shown in FIGS. 1-6, however, the phosphor film 150 is shaped by a molding stencil 170. As a result of being shaped by the molding stencil 170 and being cured, an upper surface 175A of the phosphor film 150 exhibits a convex dome-like profile over each of the LED dies 110. In other words, for each LED die 110, there is a portion of the upper surface 180 of the phosphor film 150 that is substantially rounded and curved. This geometric configuration of the phosphor film 150 helps focus light emitted by the LED dies 110 underneath, thereby serving as a lens for the LED dies 110.

It is understood that the dome-like profile for the phosphor film 150 is merely an example. In other embodiments, different profiles may be achieved for the phosphor film 150 so that the phosphor film can further serve as a desired lens for the LED dies 110. For example, FIGS. 8A-C illustrate different geometric profiles for the phosphor film 150. For reasons of simplicity, each Figure only illustrate the geometric profile for a single LED die 110, though it is understood that the same phosphor profile is achieved for each of the plurality of LED dies 110. In FIG. 8A, the phosphor film 150 is shaped (e.g., by a suitable molding stencil) so that its upper surface 175B exhibits a concave V-shape profile. In FIG. 8B, the phosphor film 150 is shaped (e.g., by a suitable molding stencil) so that its upper surface 175C exhibits a concave W-shape profile. In FIG. 8C, the phosphor film 150 is shaped (e.g., by a suitable molding stencil) so that its upper surface 175D exhibits a concave U-shape profile.

As shown in FIGS. 8A-8C, a reflective layer 178 is formed over the surfaces 175B/C/D of each of the phosphor films 150. The reflective layer 178 may contain a metal material such as silver or aluminum in some embodiments. The reflective layer 178 reflects radiation, for example light emitted by the LED dies 110. Therefore, the light will not propagate out upwards. Instead, the light will be propagated in a sideways manner due to the presence of the reflective layer 178. As such, each of the phosphor profiles shown in FIGS. 8A-8C are characterized as side-lit batwing profiles. The LED dies 110 with the phosphor coatings (serving as lenses) shown in FIGS. 8A-8C are said to be side-lit batwing emitters. In comparison, a lambertian emitter (e.g., the LED die 110 with the dome-like phosphor shape shown in FIG. 7) emits light laterally as well as vertically (i.e., straight up).

One of the advantages of shaping the phosphor film 150 to have a suitable lambertian or side-lit batwing profile is that it is cost-effective to do so. Since the phosphor film 150 itself serves as the lens, no additional secondary lenses are needed. In addition, the elimination of a potential secondary lens reduces a size of the LED package, thereby making the overall package more compact. It is understood that additional phosphor profiles may be achieved, but they are not specifically illustrated or discussed herein for reasons of simplicity. Further, for the sake of providing an illustration, the embodiment shown in FIGS. 8-9 and discussed below use a dome-like profile for the phosphor film 150, though it is understood that the other side-lit batwing profiles of FIGS. 8A-8C may be applicable as well.

Figure 10:
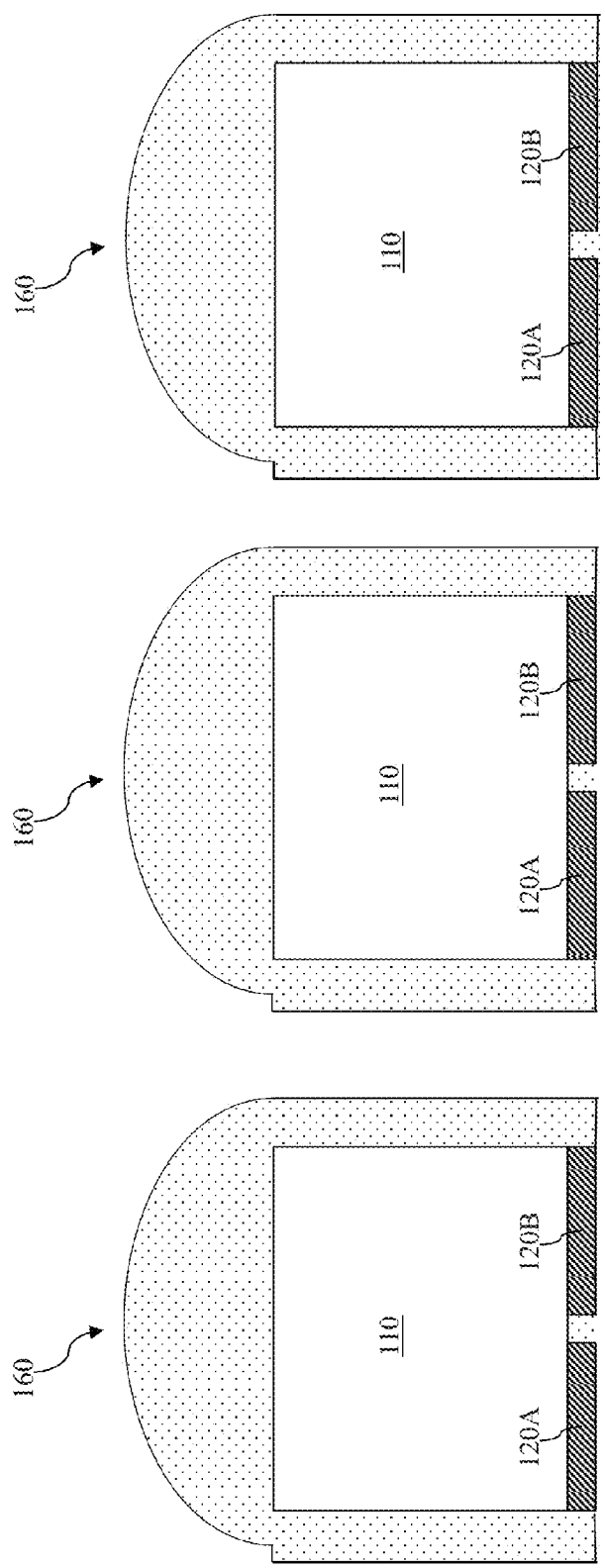

Referring now to FIG. 9, after the shaping and curing of the phosphor film 150, Thereafter, the substrate 100 is removed so as to preserve the substrate 100 for future use. In some embodiments, the tape 105 need not be removed. In other embodiments, the tape 105 is also removed, and a new tape 165 is then used to replace the removed tape 105. Thereafter, a dicing process 155 is performed to singulate the LED dies 110. As a result, individual LED chips 160 may be formed, as shown in FIG. 10. Once again, since the substrate 100 is removed before the dicing process, the substrate 100 may be reused for future fabrication/packaging processes, thereby reducing packaging time and cost.

Figure 11A:
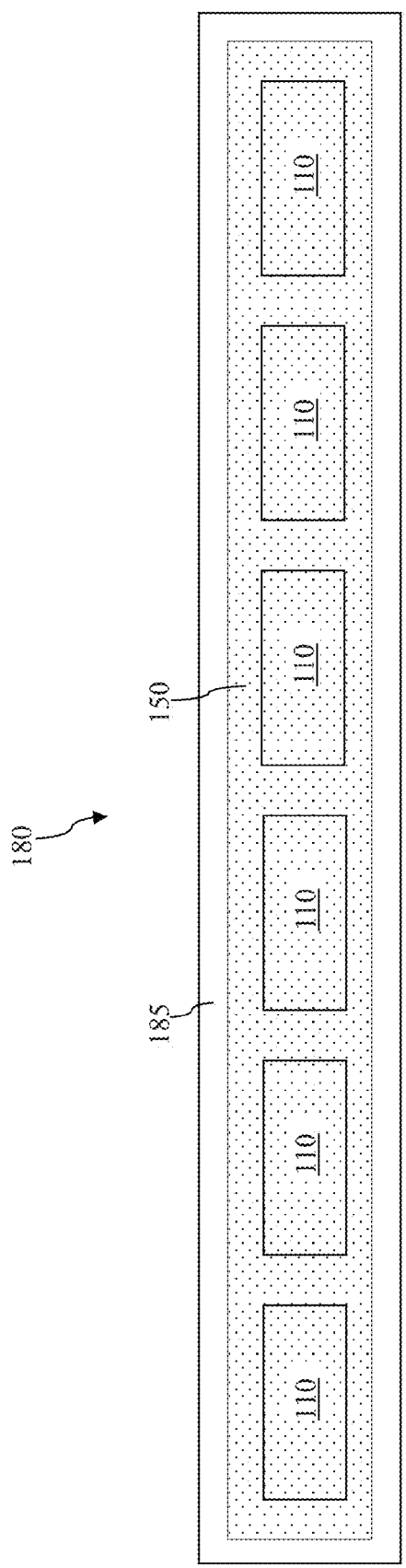

The singulated LED chips 160 shown in FIGS. 5 and 10 may be referred to as single junction LED chips. However, the concepts of the present disclosure may apply to multi-junction LED chips too. For example, referring now to FIG. 11A, a simplified diagrammatic top view of an LED lighting module 180 is shown. The LED lighting module 180 includes a plurality of LED dies 110 arranged in a row. The LED dies 110 have undergone a packaging process similar to those discussed above with reference to FIGS. 1-10. However, unlike the embodiments associated with FIGS. 1-10, the LED dies 110 are not singulated into individual LED chips. Instead, the dicing process is performed so that a plurality of them (i.e., the row of LEDs) are kept together and not diced. To accomplish this, the dicing process may be performed in only one direction (e.g., dicing only horizontally or only vertically) so that a matrix of LED dies are diced into a plurality of rows (or a plurality of columns) of LED dies. Alternatively, two dimensional dicing may still be employed, but a predetermined number of LED dies in a row (or column) will not undergo dicing for the LED dies in the row (or column), though these LED dies are still separated from adjacent rows (or columns) of LED dies by dicing. Once again, the substrate 100 is removed before the dicing process is performed, thereby allowing the substrate 100 to be reused. A phosphor film 150 may be coated over the row of LED dies 110. In any case, the row of LED dies 110 in the LED lighting module 180 may be disposed on a board 185, such as a printed circuit board (PCB).

It is understood that, with transmitting or diffusive housing, a luminaire of a T5 or T8 type light tube incorporating light module 180 can easily be formed. For example, referring to FIG. 11B, a simplified cross-sectional side view of a T5 or T8 type of light tube 186 is illustrated. The light tube 186 has a housing 187, which may be approximately circular or round. The housing 187 provides a cover and protection for the light-emitting elements housed therein, for example the phosphor-coated LED dies 110 discussed above (only one of which is shown in the cross-sectional view herein). For example, the LED dies 110 are implemented as the lighting module 180 shown in FIG. 11A, which is disposed on a PCB board 185. The PCB board 185 may be thermal conductively coupled to a heat sink 188. Once again, the phosphor coated LED dies 110 do not need a secondary lens, since the phosphor may be molded into a suitable shape to function as a suitable lens. Therefore, the light tube 186 may be flexibly configured to have a desired type of light output.

Figure 12:
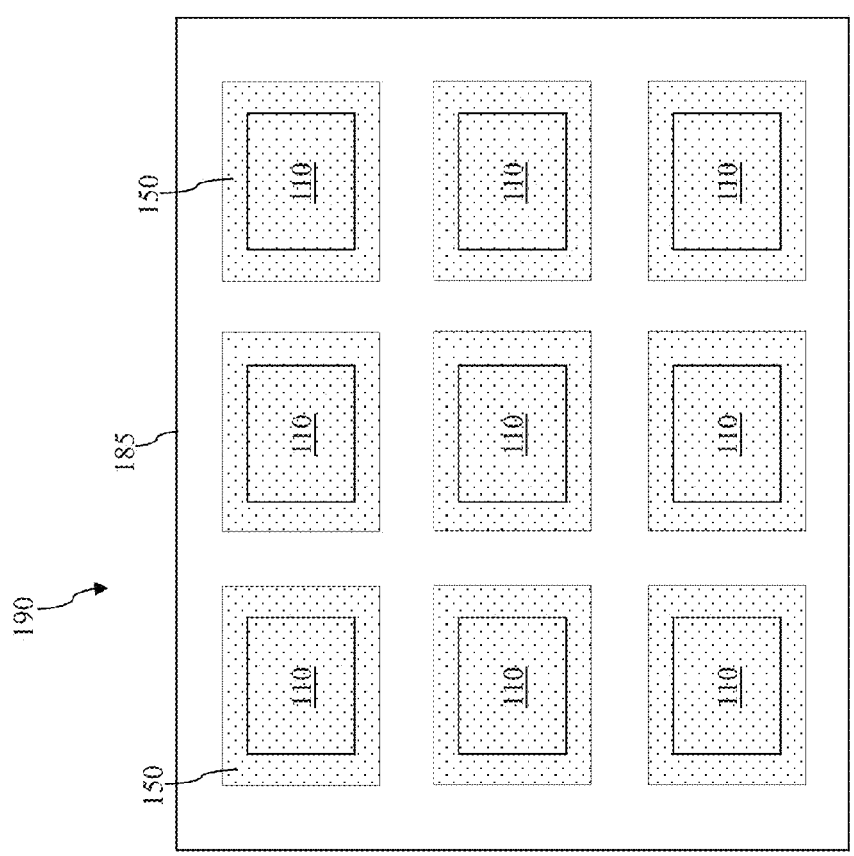
FIGS. 12-13 are diagrammatic fragmentary top views of various embodiments of LED lighting modules according to various aspects of the present disclosure.

FIG. 12 illustrates a simplified diagrammatic top view of another LED lighting module 190 having a plurality of LED dies 110 arranged in a matrix (i.e., rows and columns). These LED dies 110 have been singulated without dicing the carrier substrate. A phosphor film 150 may be applied to the LED dies 110 before the dicing process. After the dicing process, each LED die 110 is coated around with phosphor film 150. The LED dies 110 may then be placed on the board 185, such as a PCB.

Figure 13:
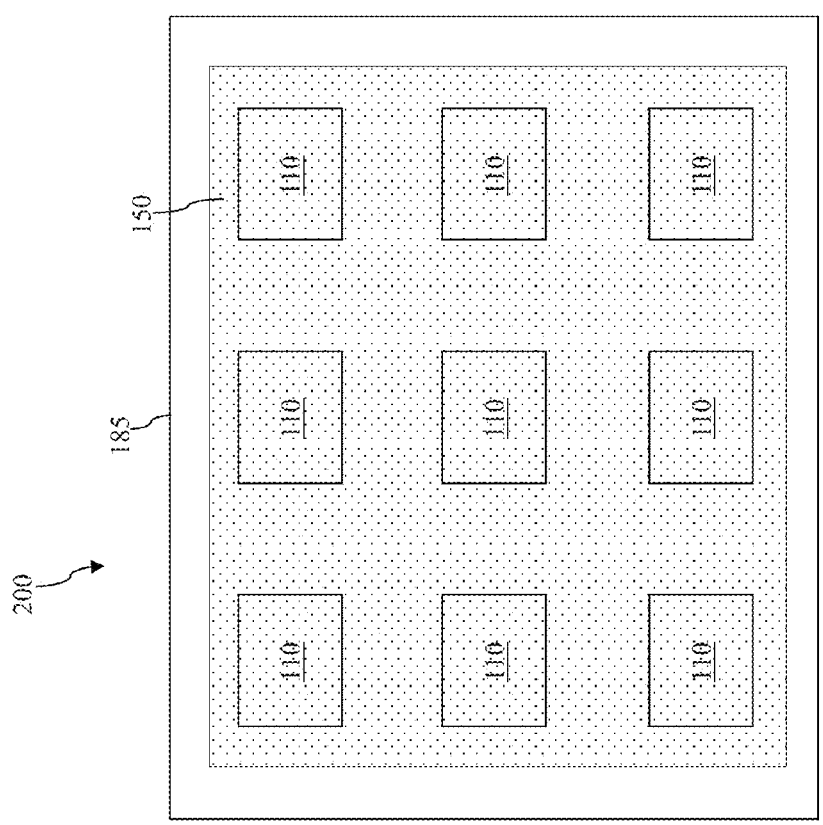

FIG. 13 illustrates a simplified diagrammatic top view of yet another LED lighting module 200 having a plurality of LED dies 110 arranged in a matrix (i.e., rows and columns). These LED dies 110 have been singulated without dicing the carrier substrate. Furthermore, these LED dies 110 may be formed as an array of LEDs. In other words, in the dicing process, these LED dies 110 are kept together (no dicing to separate them from one another), while they are collectively separated from other LED arrays. A phosphor film 150 may be collectively applied to all of the LED dies 110 before the dicing process. After the dicing process, the array of LED dies collectively is coated around with the phosphor film 150. The LED dies 110 may then be placed on the board 185, such as a PCB.

Similarly, if LED dies 110 disposed on a board 185 are in the shape of a matrix, with the transmitting or diffusing housing (for example a housing similar to the housing 187 of FIG. 11B) a luminaire of light bulbs (including MR series bulbs), par light, or down light incorporating light module 190 or 200 can easily be formed, too. For reasons of simplicity, the specific types of luminaires are not specifically illustrated herein.

Figure 14:
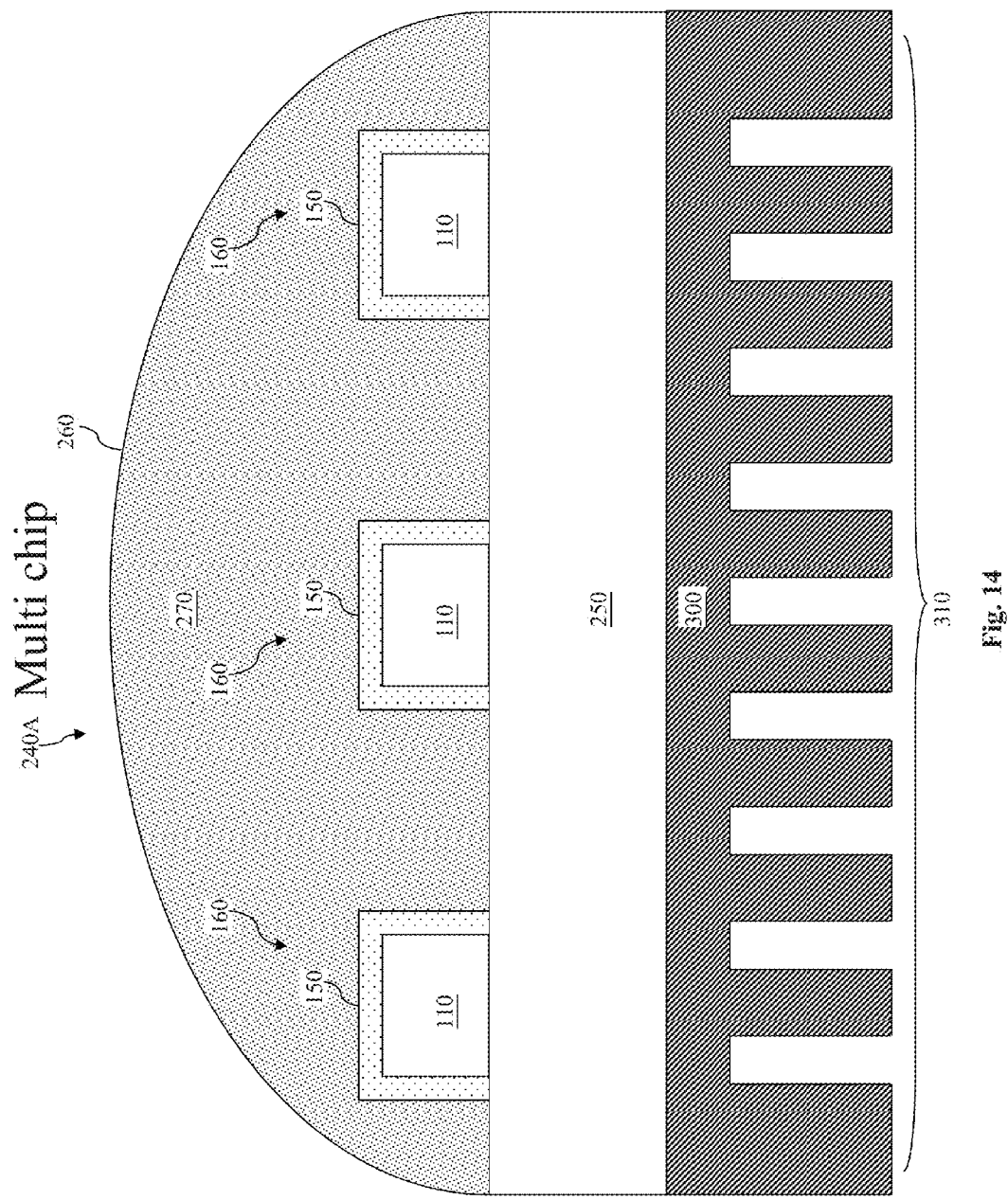
FIG. 14 is a diagrammatic fragmentary cross-sectional side view of an example lighting apparatus according to various aspects of the present disclosure.

Referring now to FIG. 14, discussed below is an example multi-chip lighting unit 240A using the LED chips 160 according to various embodiments of the present disclosure. The lighting unit 240A includes a support member 250. In some embodiments, the support member 250 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In other embodiments, the support member 250 may include other suitable materials, for example ceramic, copper, or silicon. The support member 250 may contain active circuitry and may also be used to establish interconnections.

As the name implies, the multi-chip lighting unit 240A includes a plurality of LED dies 110. The LED dies 110 are parts of the single junction phosphor-coated LED chips 160 discussed above. For reasons of simplicity, the conductive terminals of the LED chips 160 are not shown herein. In the embodiments discussed herein, the LED dies 110 are physically spaced apart from one another.

The lighting unit 240A also includes a diffuser cap 260. The diffuser cap 260 provides a cover for the LED dies 110 located on the support member 250. Stated differently, the LED dies 110 may be encapsulated by the diffuser cap 260 and the support member 250 collectively. The support member 250 may or may not be completely covered by the diffuser cap 260. In some embodiments, the diffuser cap 260 has a curved surface or profile. In some embodiments, the curved surface may substantially follow the contours of a semicircle, so that each beam of light emitted by the LED dies 110 may reach the surface of the diffuser cap 260 at a substantially right incident angle, for example, within a few degrees of 90 degrees. The curved shape of the diffuser cap 260 helps reduce Total Internal Reflection (TIR) of the light emitted by the LED dies 110. In some embodiments, the diffuser cap 260 has a textured surface for further scattering of the incident light.

In some embodiments, the space between the LED dies 110 and the diffuser cap 260 may be filled by an optical-grade silicone-based adhesive material 270, also referred to as an optical gel 270. Diffuser particles may be mixed within the optical gel 270 in these embodiments so as to further diffuse light emitted by the LED dies 110. In other embodiments, the space between the LED dies 110 and the diffuser cap 260 may be filled by air.

The support member 250 is located on a thermal dissipation structure 300, also referred to as a heat sink 300. The heat sink 300 is thermally coupled to the LED dies 110 through the support member 250. The heat sink 300 is configured to facilitate heat dissipation to the ambient atmosphere. The heat sink 300 contains a thermally conductive material, such as a metal material. The shape and geometries of the heat sink 300 may be designed to provide a framework for a familiar light bulb while at the same time spreading or directing heat away from the LED dies 110. To enhance heat transfer, the heat sink 300 may have a plurality of fins 310 that protrude outwardly from a body of the heat sink 300. The fins 310 may have substantial surface area exposed to ambient atmosphere to facilitate heat transfer. In some embodiments, a thermally conductive material may be disposed between the substrate 250 and the heat sink 300. For example, the thermally conductive material may include thermal grease, metal pads, solder, etc. The thermally conductive material further enhances heat transfer from the LED dies 110 to the heat sink 300.

Figure 15:
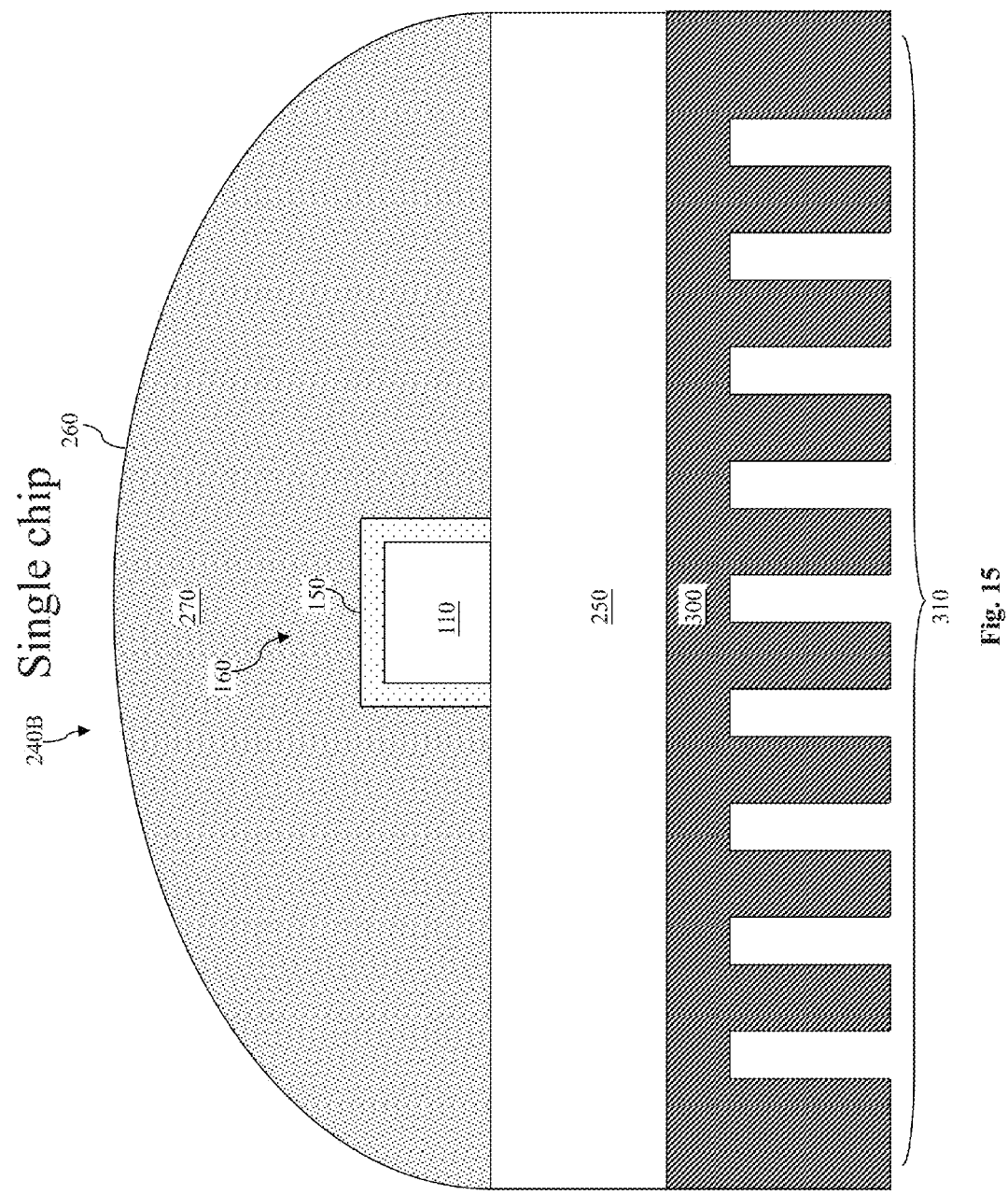
FIG. 15 is a diagrammatic fragmentary cross-sectional side view of another example lighting apparatus according to various aspects of the present disclosure.

In addition to a multi-chip lighting instrument, the concepts of the present disclosure may also apply to a single-chip lighting unit, for example a single-chip lighting unit 240B shown in FIG. 15. Instead of using a plurality of LED chips 160 as light sources (such as the multi-chip lighting instrument 240A of FIG. 14), the single-chip lighting unit 240B includes a single LED chip 160 to generate light. Similar to the multi-chip lighting unit 240A, the single-chip lighting unit 240B includes a support member 250 for housing additional electronic circuitry and providing interconnections, a diffuser cap 260 for optical considerations, an optical gel 270 disposed between the diffuser cap 260 and the support member 250, and a heat sink 300 for thermal dissipation. The single-chip lighting unit 240B may include additional components for facilitating light output, but these additional components are not discussed in detail herein for reasons of simplicity.

Figure 16:
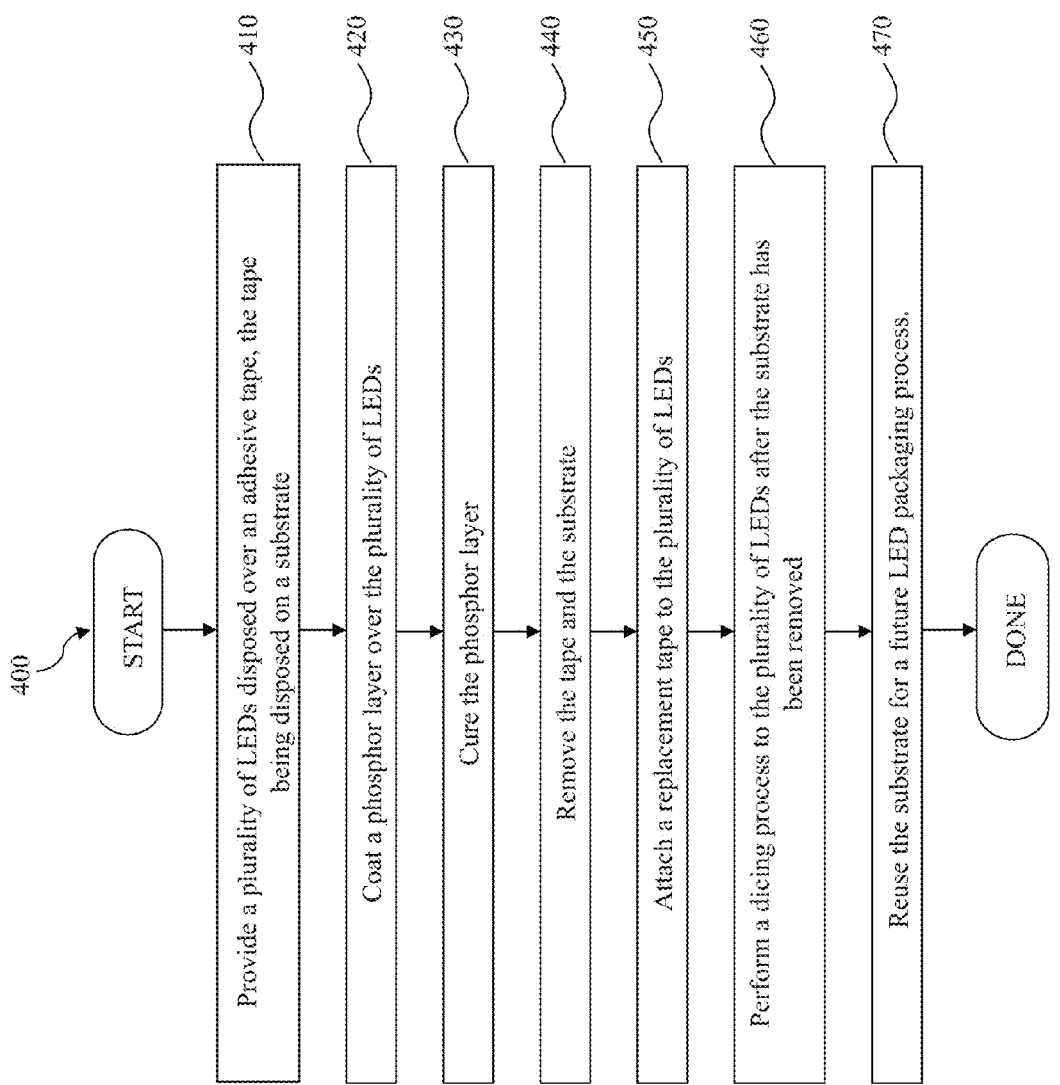
FIG. 16 is a flowchart illustrating a method of packaging an LED according to various aspects of the present disclosure.

FIG. 16 is a flowchart of a method 400 for packaging an LED according to various aspects of the present disclosure. The method 400 includes a step 410, in which a plurality of LEDs is provided. The LEDs are disposed over an adhesive tape. The tape is disposed on a substrate. In some embodiments, the substrate includes one of: a glass substrate, a silicon substrate, a ceramic substrate, and a gallium nitride substrate. In some embodiments, the LEDs are selected from a group of LEDs that are associated with a plurality of bins. The plurality of LEDs that are selected all belong to a subset of the plurality of bins.

The method 400 includes a step 420, a phosphor layer is coated over the plurality of LEDs. The phosphor layer may include a yellow phosphor or a combination of yellow and red phosphor particles. The phosphor particles may be mixed in a viscous fluid. In some embodiments, the viscous fluid may also contain diffuser particles.

The method 400 includes a step 430, in which the phosphor layer is cured. The curing of the phosphor layer helps it maintain a desired shape. In some embodiments, the curing is performed at a high temperature, for example a temperature in a range from about 130 degrees Celsius to about 170 degrees Celsius.

The method 400 includes a step 440, in which the tape and the substrate are removed.

The method 400 includes a step 450, in which a replacement tape is attached to the plurality of LEDs.

The method 400 includes a step 460, in which a dicing process is performed to the plurality of LEDs after the substrate has been removed. Therefore, the dicing process does not involve dicing the substrate.

The method 400 includes a step 470, in which the removed substrate is recycled or reused for a future LED packaging process. In other words, the removed substrate can be used as a carrier substrate for a different plurality of LEDs that need to be packaged.

Additional processes may be performed before, during, or after the blocks 410-440 discussed herein to complete the fabrication of the lighting apparatus. For example, in some embodiments, the method 400 may include a step of molding the phosphor layer such that the phosphor layer has a plurality of segments that each have a dome-like profile or a concave V-shape, U-shape, or W-shape profile. Each of these segments is disposed over a respective one of the LEDs. These segments serve as lenses for the LEDs underneath. For reasons of simplicity, other additional processes are not discussed herein.

Figure 17:
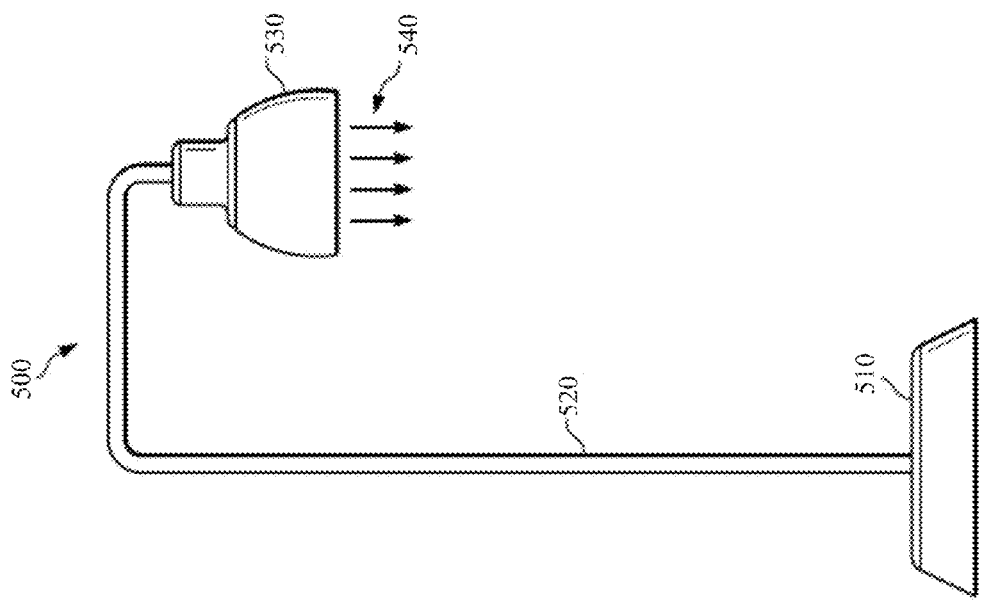
FIG. 17 is a diagrammatic view of a lighting module that includes a plurality of phosphor-coated LED dies according to various aspects of the present disclosure.

FIG. 17 illustrates a simplified diagrammatic view of a lighting system 500 that includes some embodiments of the lighting unit 240A discussed above. The lighting system 500 has a base 510, a body 520 attached to the base 510, and a lighting assembly 530 attached to the body 520. In some embodiments, the lighting assembly 530 is a down lamp (or a down light lighting module). In other embodiments, the lighting assembly 530 may be another type of light, such as a par light or a light tube. The lighting assembly 530 may be used for in-door lighting or out-door lighting, such as a street lamp or road lamp.

The lighting assembly 530 can include the lighting unit (240A or 240B) or light module (180, 190, or 200) discussed above with reference to FIGS. 1-16. In other words, the lighting assembly 530 of the lighting system 500 includes an LED-based light source, wherein the LED dies are phosphor coated in a localized manner. The LED packaging for the lighting assembly 530 is configured to produce a light output 540. It is also understood that in certain embodiments, light modules not using an optical gel or a diffuser cap may also serve as a light source (e.g., the lighting assembly 530) for the lighting system 500.

One aspect of the present disclosure involves a method. The method involves: providing a plurality of light-emitting dies disposed over a substrate; applying a phosphor material on the plurality of light-emitting dies; removing the substrate after the applying the phosphor material; and performing a dicing process to the plurality of light-emitting dies after the substrate has been removed.

In some embodiments, the method further includes: reusing the substrate for a future fabrication process.

In some embodiments, the method further includes: molding the phosphor material before the substrate has been removed so that a portion of the phosphor material disposed over each light-emitting die has a dome-like, curved, V or W shape.

In some embodiments, the substrate includes one of: a glass substrate, a silicon substrate, a ceramic substrate, and a gallium nitride substrate.

In some embodiments, the providing is performed such that an adhesive tape is disposed between the substrate and the plurality of light-emitting dies. In some embodiments, the method further includes: removing the tape; and attaching, after the substrate and the tape have been removed and before the dicing process is performed, a different tape to the plurality of light-emitting dies.

In some embodiments, the method further includes: curing the phosphor material before the substrate has been removed.

In some embodiments, the light-emitting dies include light-emitting diodes (LEDs) that have undergone a binning process.

In some embodiments, the method further includes, before the attaching: fabricating a lighting module with one or more of the light-emitting dies as its light source.

Another aspect of the present disclosure involves a method of packaging light-emitting diodes (LEDs). The method involves: attaching a tape to a plurality of LEDs, the tape being disposed on a substrate; coating a phosphor film around the plurality of LEDs; curing the phosphor film; removing the substrate after the curing; and singulating the LEDs after the substrate has been removed.

In some embodiments, the method further includes: recycling the substrate for a future LED packaging process.

In some embodiments, the method further includes: configuring, before the substrate has been removed, a shape of the phosphor film with a molding apparatus. In some embodiments, the configuring is performed so that the phosphor film is shaped to have a plurality of domes, and wherein the domes are disposed over the LEDs, respectively.

In some embodiments, the substrate includes one of: a glass substrate, a silicon substrate, a ceramic substrate, and a gallium nitride substrate.

In some embodiments, the method further includes: before the singulating the LEDs: removing the tape; replacing the removed tape with a different tape.

In some embodiments, the singulating comprises a mechanical die-saw process.

In some embodiments, the method further includes: performing a binning process to a group of LEDs; and thereafter selecting a subset of the group of LEDs as the plurality of LEDs to be attached to the tape.

Another aspect of the present disclosure involves a method of fabricating light-emitting diodes (LEDs). The method involves: providing a plurality of LEDs disposed over an adhesive tape, the tape being disposed on a substrate, wherein the substrate includes one of: a glass substrate, a silicon substrate, a ceramic substrate, and a gallium nitride substrate; coating a phosphor layer over the plurality of LEDs; curing the phosphor layer; removing the tape and the substrate after the curing; attaching a replacement tape to the plurality of LEDs; performing a dicing process to the plurality of LEDs after the substrate has been removed; and reusing the substrate for a future LED packaging process.

In some embodiments, the method further includes molding the phosphor layer such that the phosphor layer has a plurality of curved segments that are each disposed over a respective one of the LEDs.

In some embodiments, the providing comprises: selecting the plurality of LEDs from a group of LEDs that are associated with a plurality of bins, and wherein the plurality of LEDs selected all belong to a subset of the plurality of bins.

Yet another aspect of the present disclosure involves a method of packaging light-emitting diodes (LEDs). The method includes: attaching a tape to a plurality of LEDs, the tape being disposed on a substrate; coating a phosphor film around the plurality of LEDs; curing the phosphor film; removing the substrate after the curing; and singulating the LEDs after the substrate has been removed.

In some embodiments, the removing the substrate is performed in a manner such that the substrate can be recycled.

In some embodiments, the method includes: molding, before the substrate has been removed, a shape of the phosphor film with a molding stencil. In some embodiments, the molding is performed so that the phosphor film is shaped into a plurality of portions that each have one of the following shapes: a concave V-shape, a concave W-shape, and a concave U-shape, plurality of domes, and wherein each portion of the phosphor film is disposed over a different one of the LEDs, respectively. In some embodiments, the method may further include: forming a reflective layer over the phosphor film after the curing the phosphor film but before the removing the substrate. In some embodiments, the molding is performed so that the phosphor film is shaped into a plurality of portions that each have a convex dome-like shape, and wherein each portion of the phosphor film is disposed over a different one of the LEDs, respectively.

In some embodiments, the singulating further comprises: mechanically sawing an area between LEDs to separate the LEDs.

In some embodiments, the method further includes: binning a group of LEDs into a plurality of bins; and thereafter selecting LEDs in a subset of the plurality of bins as the plurality of LEDs to be attached to the tape.

Another aspect of the present disclosure involves a method of fabricating light-emitting diodes (LEDs). The method includes: providing a plurality of LEDs disposed over an adhesive tape, the tape being disposed on a substrate, wherein the substrate includes one of: a glass substrate, a silicon substrate, a ceramic substrate, and a gallium nitride substrate; coating a phosphor layer over the plurality of LEDs, the phosphor layer containing multiple sub-layers; curing the phosphor layer; forming a reflective layer over the phosphor layer; de-taping the tape after the forming of the reflective layer; removing the substrate after the forming of the reflective layer, the removing the substrate being performed in a manner such that the substrate is re-usable; attaching a replacement tape to the plurality of LEDs; and performing a dicing process to the plurality of LEDs after the substrate has been removed.

In some embodiments, one of the sub-layers of the phosphor layer contains a gel mixed with phosphor particles, and the other one of the sub-layers contains a gel mixed with diffuser particles.

In some embodiments, one of the sub-layers of the phosphor layer contains yellow phosphor particles mixed with a gel, and the other one of the sub-layers contains red phosphor particles mixed with a gel.

In some embodiments, the reflective layer contains silver or aluminum.

In some embodiments, the method further includes: molding the phosphor layer such that the phosphor layer has a plurality of predetermined segments that are each disposed over a respective one of the LEDs. In some embodiments, the predetermined segments each have one of: a concave V-shape, a concave U-shape, and a concave W-shape. In some embodiments, the predetermined segments each have a convex dome-like shape.

In some embodiments, the providing comprises: selecting the plurality of LEDs from a group of LEDs that are associated with a plurality of bins, and wherein the plurality of LEDs selected all belong to a subset of the plurality of bins.

Another aspect of the present disclosure involves a lighting apparatus. The lighting apparatus includes: a white light-emitting die that includes: a first-type semiconductor layer; a light emitting layer disposed over the first-type semiconductor layer; a second-type semiconductor layer disposed over the light emitting layer; two conductive terminals disposed on a surface of the second-type semiconductor layer away from the first-type semiconductor layer; and a phosphor film under which the first-type semiconductor layer, the light emitting layer, the second-type semiconductor layer, and the two conductive terminals are covered, wherein the phosphor film includes a first sub-layer and a second sub-layer disposed over the first sub-layer.

In some embodiments, the first sub-layer contains a gel mixed with phosphor particles, and the second sub-layer contains a gel mixed with diffuser particles.

In some embodiments, the first sub-layer contains yellow phosphor particles mixed with a gel, and the second sub-layer contains red phosphor particles mixed with a gel.

In some embodiments, the phosphor film has a convex dome-like shape.

In some embodiments, the phosphor film has one of the following shapes: a concave V-shape, a concave U-shape, or a concave W-shape. In some embodiments, the lighting apparatus further includes a reflective layer disposed over the phosphor film.

In some embodiments, a refractive index of the phosphor film is in a range from about 1.4 to about 2.0.

In some embodiments, the lighting apparatus further includes: a supporting member on which a plurality of the white light-emitting dies are located. In some embodiments, the lighting apparatus further includes a housing inside which the supporting member and the plurality of white light-emitting dies are located. In some embodiments, the housing is configured for one of: a light bulb, a light tube, a par light, and a down light. In some embodiments, the plurality of white light-emitting dies are arranged in a row. In some embodiments, the plurality of white light-emitting dies are arranged in matrix.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting apparatus, comprising:
    a white light-emitting die that includes:
        a first-type semiconductor layer;
        a light emitting layer disposed over the first-type semiconductor layer;
        a second-type semiconductor layer disposed over the light emitting layer;
        a first conductive terminal electrically connected to the first-type semiconductor layer;
        a second conductive terminals disposed on a surface of the second-type semiconductor layer; and
        a phosphor film under which the first-type semiconductor layer, the light emitting layer, the second-type semiconductor layer, and the two conductive terminals are covered, wherein the phosphor film includes a first sub-layer and a second sub-layer disposed over the first sub-layer, and wherein the first sub-layer contains yellow phosphor particles mixed with a gel, and the second sub-layer contains red phosphor particles mixed with a gel.

2. The lighting apparatus of claim 1, wherein the first sub-layer contains a gel mixed with phosphor particles, and the second sub-layer contains a gel mixed with diffuser particles.

3. The lighting apparatus of claim 1, wherein the phosphor film has a convex dome-like shape.

4. The lighting apparatus of claim 1, wherein the phosphor film has one of the following shapes: a concave V-shape, a concave U-shape, or a concave W-shape.

5. The lighting apparatus of claim 4, further comprising a reflective layer disposed over the phosphor film.

6. The lighting apparatus of claim 1, wherein a refractive index of the phosphor film is in a range from about 1.4 to about 2.0.

7. The lighting apparatus of claim 1, further comprising: a supporting member on which a plurality of the white light-emitting dies are located.

8. The lighting apparatus of claim 7, further comprising a housing inside which the supporting member and the plurality of white light-emitting dies are located.

9. The lighting apparatus of claim 8, wherein the housing is configured for one of: a light bulb, a light tube, a par light, and a down light.

10. The lighting apparatus of claim 7, wherein the plurality of white light-emitting dies are arranged in a row.

11. The lighting apparatus of claim 7, wherein the plurality of white light-emitting dies are arranged in matrix.

12. A lighting apparatus, comprising:
    a light-emitting diode (LED) that includes:
        a first-type semiconductor layer;
        a light emitting layer disposed over the first-type semiconductor layer; and
        a second-type semiconductor layer disposed over the light emitting layer, the first-type semiconductor layer and the second-type semiconductor layer having different types of conductivity;

a phosphor film coated around the LED, wherein the phosphor film includes a first sub-layer and a second sub-layer disposed over the first sub-layer, wherein the first sub-layer contains a gel mixed with phosphor particles, wherein the second sub-layer contains a gel mixed with diffuser particles or a gel mixed with different phosphor particles than the first sub-ayer, and wherein the phosphor film has one of the following shapes: a convex dome-like shape, a concave V-shape, a concave U-shape, or a concave W-shape; and a reflective layer disposed over the phosphor film.

13. The lighting apparatus of claim 12, further comprising:
a plurality of LEDs that each have a phosphor film coated thereon;
a supporting member on which the plurality of LEDs is located; and
a housing that houses the supporting member and the plurality of LEDs within.

14. The lighting apparatus of claim 13, wherein:
the housing is configured for one of: a light bulb, a light tube, a par light, and a down light; and
the plurality of LEDs is arranged in a row or in a matrix.

15. The lighting apparatus of claim 12, wherein the LED includes a first conductive terminal electrically connected to the first-type semiconductor layer and a second conductive terminal disposed on a surface of the second-type semiconductor layer.

16. The lighting apparatus of claim 12, wherein the diffuser particles include silica, PMMA, $ZrO_2$, or silicon.

17. A lighting apparatus, comprising:
a plurality of light-emitting diodes (LEDs), wherein each LED includes:
a first-type semiconductor layer;
a light emitting layer disposed over the first-type semiconductor layer;
a second-type semiconductor layer disposed over the light emitting layer;
a phosphor film conformally coated on an upper surface and side surfaces of the LED; and
a reflective layer disposed over the phosphor film,
a supporting member on which the plurality of LEDs is located; and
an encapsulation structure that houses the supporting member and the plurality of LEDs therein;
wherein:
the phosphor film has one of the following shapes: a convex dome-like shape, a concave V-shape, a concave U-shape, or a concave W-shape;
the phosphor film includes a first sub-layer and a second sub-layer disposed over the first sub-layer;
the first sub-layer contains a gel mixed with phosphor particles; and
the second sub-layer contains a gel mixed with diffuser particles or a gel mixed with phosphor particles different from those within the first sub-layer.

18. The lighting apparatus of claim 17, wherein: the housing is configured for one of: a light bulb, a light tube, a par light, and a down light.

19. The lighting apparatus of claim 17, wherein the plurality of LEDs are arranged in a row or in a matrix.

20. The lighting apparatus of claim 18, wherein the diffuser particles include silica, PMMA, $ZrO_2$, or silicon.

* * * * *